United States Patent [19]
Lin et al.

[11] Patent Number: 6,078,076
[45] Date of Patent: Jun. 20, 2000

[54] VERTICAL CHANNELS IN SPLIT-GATE FLASH MEMORY CELL

[75] Inventors: Chrong-Jung Lin, Taipei; Chia-Ta Hsieh, Tainan; Jong Chen, Taipei; Di-Son Kuo, Hsinchu, all of Taiwan

[73] Assignee: Taiwan Semiconductor Manufacturing Company, Hsin-Chu, Taiwan

[21] Appl. No.: 09/317,645

[22] Filed: May 24, 1999

Related U.S. Application Data

[62] Division of application No. 08/988,772, Dec. 11, 1997, Pat. No. 5,970,341.

[51] Int. Cl.$^7$ ................................................. H01L 29/788
[52] U.S. Cl. ..................... 257/321; 257/316; 257/315; 257/314; 438/594; 438/259
[58] Field of Search ..................................... 257/314, 315, 257/316, 324, 321; 438/594, 593, 589, 259, 257

[56] References Cited

U.S. PATENT DOCUMENTS

| | | | |
|---|---|---|---|
| 5,045,490 | 9/1991 | Esquivel et al. | 437/43 |
| 5,313,421 | 5/1994 | Guterman et al. | 365/185 |
| 5,467,305 | 11/1995 | Bertin et al. | 365/185.01 |
| 5,595,927 | 1/1997 | Chen et al. | 437/52 |
| 5,786,612 | 7/1998 | Otani et al. | 257/316 |

*Primary Examiner*—Tom Thomas
*Assistant Examiner*—Douglas W. Owens
*Attorney, Agent, or Firm*—George O. Saile; Stephen B. Ackerman; Graham S. Jones, II

[57] ABSTRACT

A method of forming a vertical memory split gate flash memory device on a silicon semiconductor substrate is provided by the following steps. Form a floating gate trench hole in the silicon semiconductor substrate, the trench hole having trench surfaces. Form a tunnel oxide layer on the trench surfaces, the tunnel oxide layer having outer surfaces. Form a floating gate electrode layer filling the trench hole on the outer surfaces of the tunnel oxide layer. Form source/drain regions in the substrate self-aligned with the floating gate electrode layer. Pattern the floating gate electrode layer by removing the gate electrode layer from the drain region side of the trench hole Form a control gate hole therein. Form an interelectrode dielectric layer over the top surface of the floating gate electrode, and over the tunnel oxide layer. Form a control gate electrode over the interelectrode dielectric layer over the top surface of the floating gate electrode and extending down into the control gate hole in the trench hole.

20 Claims, 7 Drawing Sheets

VERTICAL CHANNELS IN SPLIT-GATE FLASH MEMORY CELL

This is a division of patent application Ser. No. 08/988,722, now U.S. Pat. No. 5,970,341, filing date Dec. 11, 1997, Method For Forming Vertical Channels In Split-Gate Flash Memory Cell And Device Manufactured Thereby, assigned to the same assignee as the present invention.

BACKGROUND OF THE INVENTION

1. Field of the Invention

This invention relates to semiconductor memory devices and more particularly to vertical channel flash EEPROM memory devices.

2. Description of Related Art

An EPROM (Erasable Programmable Read Only Memory) provides long term storage of charge of a floating gate doped polysilicon electrode in a device such as an FET (Field Effect Transistor) device. In a MOSFET PROM device source/drain regions are formed on either side of a channel in a semiconductor substrate below a tunnel oxide dielectric layer and a floating gate doped polysilicon electrode, above which are a interpolysilicon dielectric layer and a control gate doped polysilicon electrode. Usually the EPROM is programmable (stores data) electrically by injection of hot electrons into the floating gate electrode. An EPROM can be erased, with utltraviolet light. An EPROM erased electrically is an EEPROM device described next.

An EEPROM (Electrically Erasable Programmable Read Only Memory) device includes an array of memory cells which can be erased electrically.

In a flash EEPROM device memory cells can be erased electrically, simultaneously with an electrical erase signal, instantaneously (within a few seconds) by Fowler-Nordheim tunneling of the charge from the floating gate into the drain region.

Some disadvantages of currently available flash memory cells are as follows:

1. A large cell area is required for split-gate flash memory cells available heretofore.
2. There has been a punch-through issue for split-gate flash memory cells available in the past.
3. There is a planarization issue for flash memory cells available prior to this invention.

U.S. Pat. No. 5,045,490 of Esquivel et al. for "Method for Making a Pleated Floating Gate Trench EPROM" shows a method of making a pleated floating gate trench EPROM device.

U.S. Pat. No. 5,313,421 of Guterman et al. for "EEPROM with Split Gate Source Side Injection" shows a method/structure of an EEPROM device including a floating gate and a control gate electrode in a split gate configuration which provides injection of electrons to charge the floating gate near the source side of the channel of the EEPROM device.

U.S. Pat. No. 5,467,305 of Bertin et al. for "Three-Dimensional Direct-Write EEPROM Arrays and Fabrication Methods" shows a three-dimensional EEPROM array formed in a trench.

U.S. Pat. No. 5,595,927 of Chen et al. for "Method for Making Self-Aligned Source/Drain Mask ROM Memory Cell Using Trench Etched Channel" shows a method for making a ROM using an etched trench channel.

SUMMARY OF THE INVENTION

In accordance with another aspect of this invention, a vertical memory split gate flash memory device on a silicon semiconductor substrate comprises: a floating gate trench hole in the silicon semiconductor substrate, the trench hole having trench surfaces including sidewalls and a base within the trench hole, a tunnel oxide layer formed on the trench surfaces, the tunnel oxide layer having outer surfaces, a floating gate electrode layer having originally filled the trench hole on the outer surfaces of the tunnel oxide layer, the floating gate electrode layer having been polished down to the surface of the substrate in the trench hole, source/drain regions in the substrate self-aligned with the floating gate electrode layer, the floating gate electrode layer having a control gate hole formed adjacent thereto in the trench hole down to the tunnel oxide layer on the drain region side of the trench hole, an interelectrode dielectric layer over the top surface of the floating gate electrode, and over the tunnel oxide layer, a control gate electrode over the interelectrode dielectric layer over the top surface of the floating gate electrode and extending down into the control gate hole in the trench hole.

Preferably, the trench hole has a depth from about 2,000 Å to about 8,000 Å.

Preferably, the tunnel oxide layer has a thickness from about 70 Å to about 150 Å, and the floating gate electrode has a thickness of from about 500 Å to about 2,000 Å.

Preferably, the threshold implant comprises boron which was implanted with a concentration of dopant from about 5 E 16 atoms/cm$^3$ to about 5 E 17 atoms/cm$^3$.

Preferably, source/drain regions were ion implanted with atoms selected from the group consisting of arsenic and phosphorus ions with a concentration of dopant from about 5 E 19 atoms/cm$^3$ to about 5 E 20 atoms/cm$^3$.

Preferably, the floating gate electrode comprises doped polysilicon.

Preferably, a source line and a drain line are formed on opposite sides of the trench hole, the source line region is provided on the source side of the trench hole aligned with and adjacent to the source region, the drain line region is provided on the drain side of the trench hole aligned with and over the drain region; the source line region and the drain line region were doped with an N-type dopant selected from the group consisting of arsenic and phosphorus ions with a concentration of dopant from about 5 E 19 atoms/cm$^3$ to about 1 E 20 atoms/cm$^3$; the floating gate electrode comprises doped polysilicon with a thickness from about 500 Å to about 2,000 Å; and the control gate electrode comprises doped polysilicon with a thickness from about 1,000 Å to about 2,500 Å.

Preferably, the following memory cell operation conditions obtain:

|  |  | Prog. | Erase | Read |
|---|---|---|---|---|
| BIT LINE | Sel. | $V_{cc}$ | Floating | $V_{cc}$ |
| (DRAIN) | Unsel. | 0 | 0 | 0 |
| WORD LINE | Sel. | $V_{cc}$ | ($V_{pp}$) | $V_{cc}$ |
| (GATE) | Unsel. | 0 | 0 | 0 |
| SOURCE | Sel. | $V_{pp}$ | $V_{cc}$ | 0 |
|  | Unsel. | 0 | 0 | 0 |
| BULK | Sel. | 0 | 0 | 0 |
|  | Unsel. | 0 | 0 | 0 |

Advantages of this invention are as follows:

1. A unit cell can take less cell area but with more channel area.
2. Because the floating gate electrode is located under the wafer surface, the step height of the cell gate electrode stack is much lower than that of a traditional gate electrode stack. As a result following etch steps, (e.g. cell gate electrode etching and contact hole etching) are far easier.

3. The source side junction which is used for source side injection, is patterned, in part, by the depth of the source-line diffusion process. As a result, the floating gate voltage $V_{FG}$ can be easily dominated by the source side voltage to inject electrons from the channel into the floating gate electrode through the tunnel oxide layer.

4. There is a large control gate to floating gate overlap area for this cell. As a result, this cell can use lower control gate voltage for the erase function, which provides for high efficiency for the source erase function.

5. Because there is a much larger area of the tunnel oxide layer located between the source region and the floating gate electrode than that of the traditional structure, the erasing speed is far faster also.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
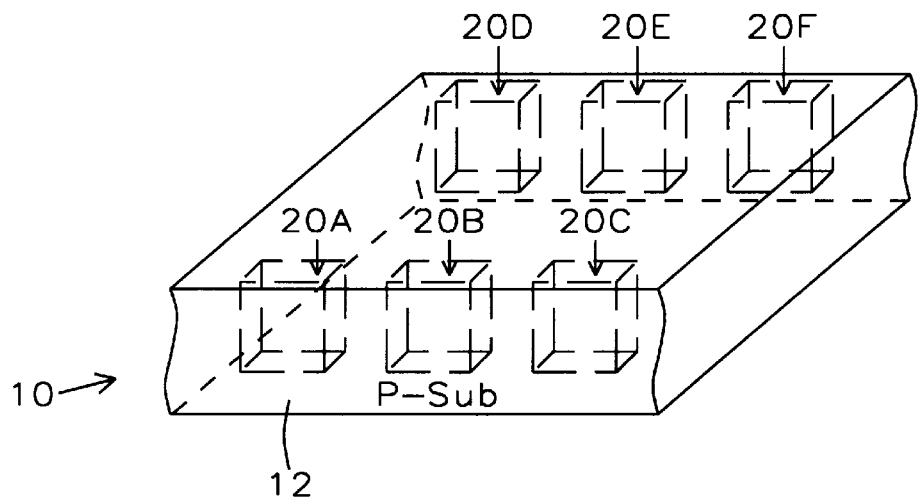
FIG. 1 shows a device in accordance with this invention in an early stage of manufacture wherein an array of two rows of trench holes in the first row and trench holes in the second row, have been provided in a semiconductor substrate.

FIG. 1 shows a device 10 in accordance with this invention in an early stage of manufacture wherein an array of two rows of trench holes 20A, 20B and 20C in the first row and trench holes 20D, 20E and 20F in the second row, have been provided in a P-doped silicon semiconductor substrate 12. Only six such holes are shown for convenience of illustration in FIG. 1. The trench holes have a depth from about 3,000 Å to about 8,000 Å. Each of the trench holes 20A–20F defines a hollow space in the substrate 12 with an opening through the top surface of said substrate 12. The trench holes 20A–20F are defined by trench surfaces including sidewalls and a base formed within the substrate 12. The trench holes 20A–20F are shown in the form of cubic spaces formed in substrate 12 with the top surfaces of the cubic spaces comprising openings in the top surface of substrate 12.

Figure 2:
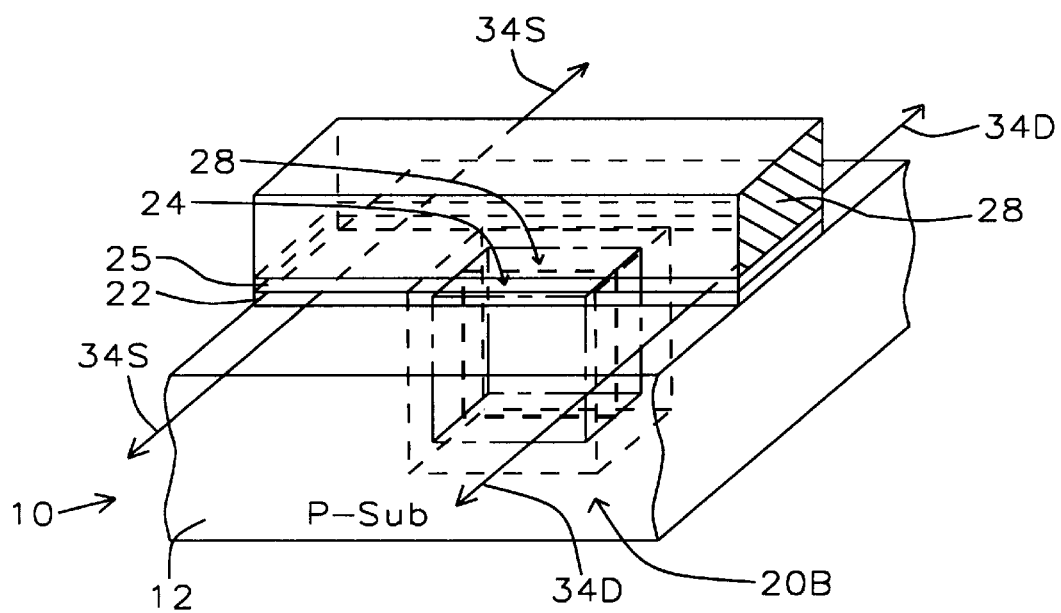
FIG. 2 shows a fragment of the device of FIG. 1 centered on a trench hole after completion of a vertical channel split-gate flash memory device.

FIG. 2 shows a fragment of the device 10 of FIG. 1 centered on trench hole 20B, after completion of a vertical channel split-gate flash memory device 10 manufactured in accordance with the method of this invention. On the substrate 12 and on the walls and base of the trench hole 20B, a tunnel oxide layer 22 was formed. Then a floating gate electrode 24 was formed on exposed surfaces of the tunnel oxide layer 22 on one side of one of the trench hole 20B. An interpolysilicon dielectric layer 25 covers the exposed surfaces of the tunnel oxide layer 22 over the top of the substrate 12 and the exposed surfaces of floating gate electrode 24. In addition the tunnel oxide layer 22 on the exposed walls of the trench hole 20B and on the bottom of trench hole 20B is covered with the interpolysilicon dielectric layer 25. Next, a control gate electrode 28 was formed over interpolysilicon dielectric layer 25 above the floating gate electrode 24. In addition, the control gate electrode 28 extends across the surface of the interpoly-silicon dielectric layer 25 above the diffusion source line 34S and the diffusion drain line 34D. The source/drain regions 32S and 32D formed in the substrate 12 adjacent to the hole 20B are not shown for convenience of illustration, but they can be seen in FIGS. 13–15 as will be explained in more detail below.

The control gate electrode 28, which also overlies the hole 20B, is separated from the substrate 12 and the floating gate electrode 24 by the interpoly-silicon dielectric layer 18.

Figure 3:
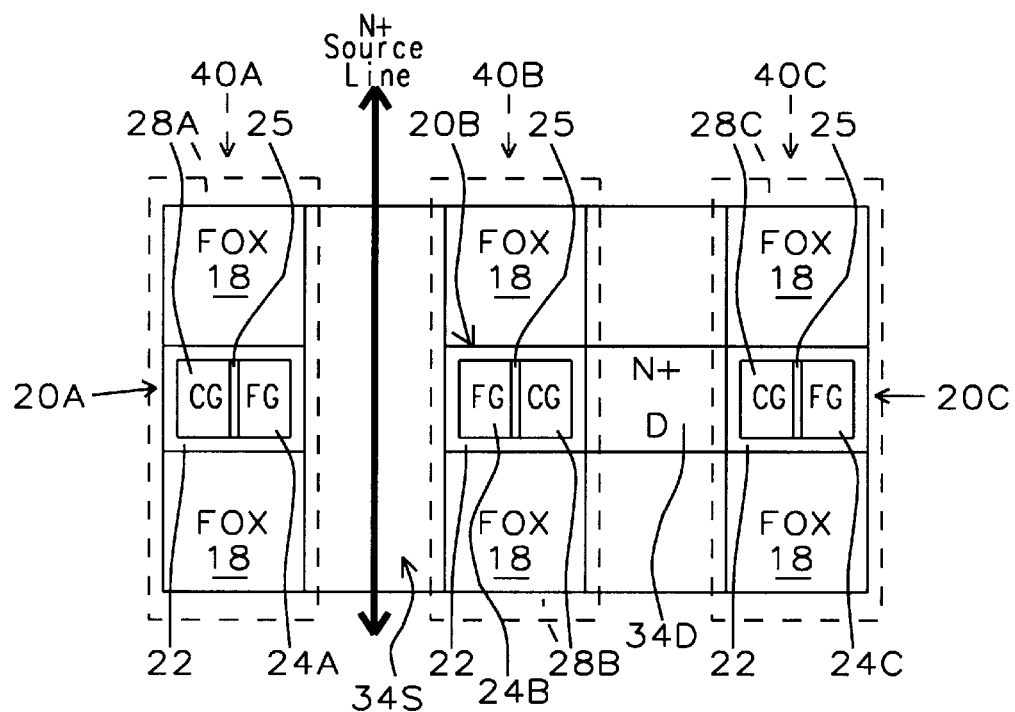
FIG. 3 shows a plan view of a set of flash memory gate electrode units formed on a substrate in accordance with the devices seen in FIGS. 2 and 15.
Figure 15:
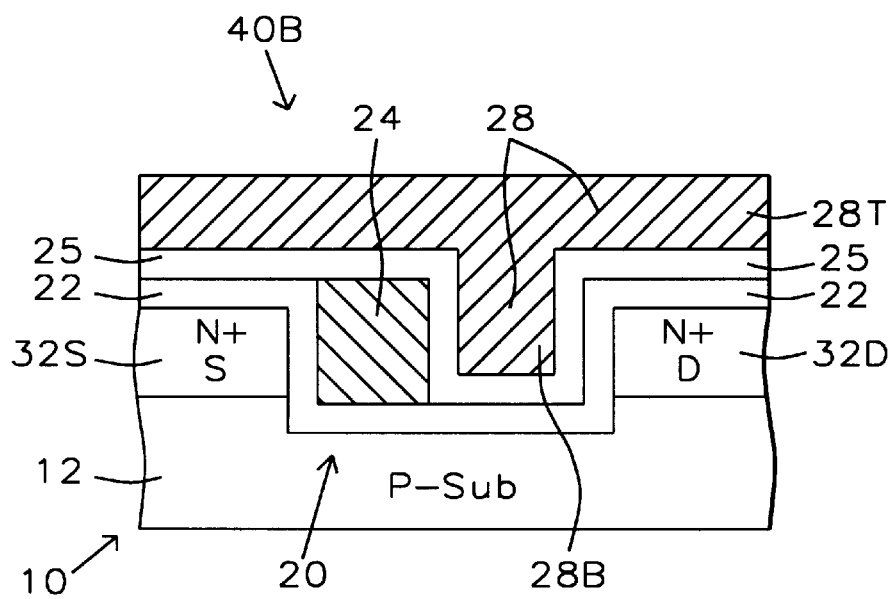
FIG. 15 shows the device of FIG. 14 after formation of a blanket interelectrode composed of ONO (silicon Oxide/silicon Nitride/silicon Oxide) or a CVD oxide, etc. dielectric layer.

FIG. 3 shows a plan view of a set of flash memory gate electrode units 40A, 40B and 40C formed on a substrate 12 in accordance with the devices 10, as seen in FIGS. 2 and 15. Each device includes a pair of FOX regions 18 on the top and the bottom of each of the cells 40A, 40B and 40C with the floating gate electrode 24 and a portion of the control gate electrode 28 formed side-by-side (separated by inter-electrode dielectric layer 25) in the trench holes 20A, 20B and 20C. The floating gate electrodes 24 are on the sides of the trench holes 20A, 20B and 20C which are closest to the N+ source line 34S (which extends up and down the device as indicated by the dark line with double arrows) and the portion of control gate electrode 28 which reaches down into the trench holes 20A, 20B and 20C are nearest to the drain regions 34D (which is located between gate electrode units 40B and 40C, as well as a drain region not shown for gate electrode unit 40A.

Figure 4:
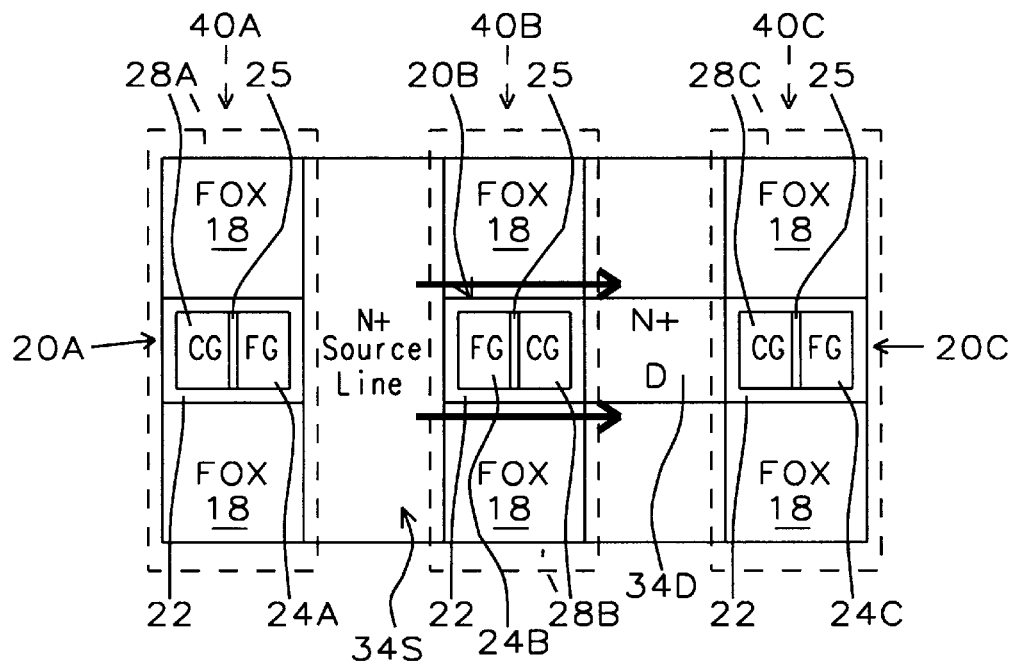
FIG. 4 shows the device of FIG. 3 illustrating the channel current paths during source side injection with the vertical channel surfaces during programming.

FIG. 4 shows the device of FIG. 3 illustrating the channel current paths during source side injection with the vertical channel surfaces during programming. The source side injection paths from the N+ source line 34S along the sides of the floating gate 28B in gate electrode unit 40B in trench hole 20B.

The parameters for the source side injection paths are as follows:

$I_D$@100 $\mu$A, $V_{cc}=V_{cc}$, $V_s=V_{PP}$, $V_B=0V$.

Figure 5:
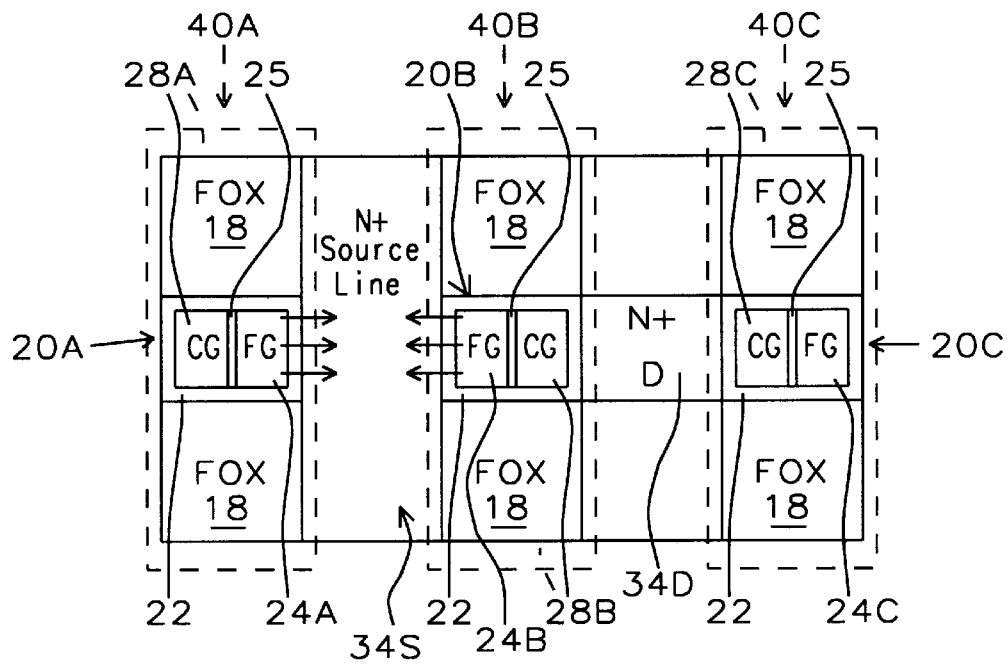
FIG. 5 shows the device of FIG. 3 illustrating the electron tunneling paths from the floating gate electrodes directed into the N+ source line during erasing.

FIG. 5 shows the device of FIG. 3 illustrating the electron tunneling paths from the floating gate electrodes 24A and 24B directed into the N+ source line 34S during erasing.

The parameters for the erasing are as follows:

$V_D$=Floating, $V_s=V_{cc}$, $V_{cc}=-V_{pp}$, $V_B=0V$.

Figure 6:
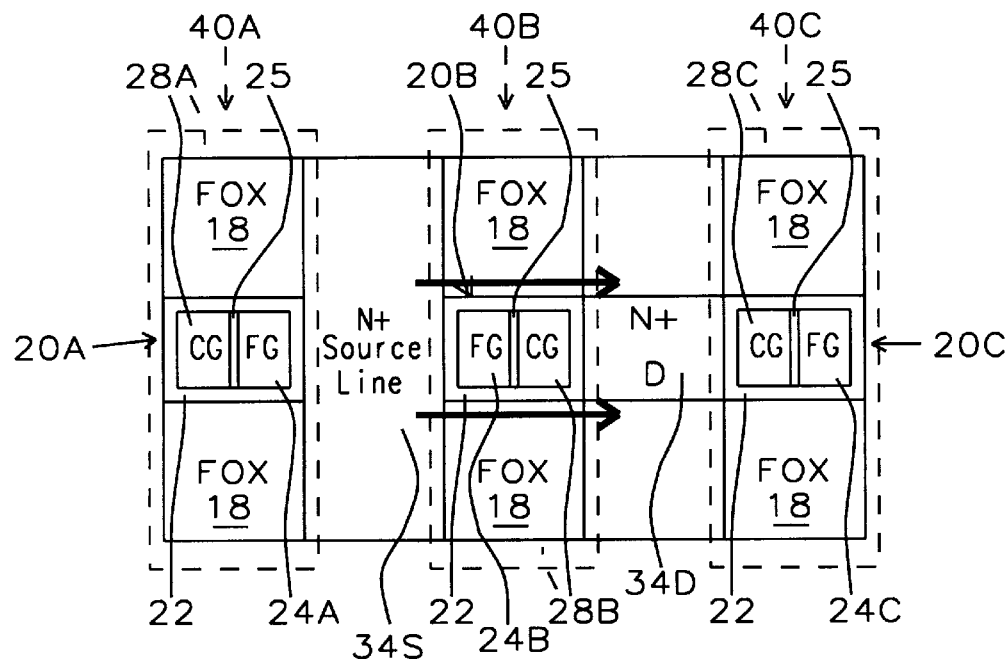
FIG. 6 shows the device of FIG. 3 illustrating the electron paths from the source line to the drain sides of the N+ drain region during reading.

FIG. 6 shows the device of FIG. 3 illustrating the electron paths from the source line 34S to the drain sides of N+ drain region 34D during reading.

The parameters for the reading are as follows:

$V_D=V_{cc}$, $V_{cc}=V_{cc}$, $V_s=V_B=0V$.

TABLE I

MEMORY CELL OPERATION CONDITIONS

| | | Prog. | Erase | Read |
|---|---|---|---|---|
| BIT LINE | Sel. | $V_{cc}$ | Floating | $V_{cc}$ |
| (DRAIN) | Unsel. | 0 | 0 | 0 |
| WORD LINE | Sel. | $V_{cc}$ | ($V_{pp}$) | $V_{cc}$ |
| (GATE) | Unsel. | 0 | 0 | 0 |
| SOURCE | Sel | $V_{pp}$ | $V_{cc}$ | 0 |
| | Unsel. | 0 | 0 | 0 |
| BULK | Sel | 0 | 0 | 0 |
| | Unsel. | 0 | 0 | 0 |

Figure 7A:
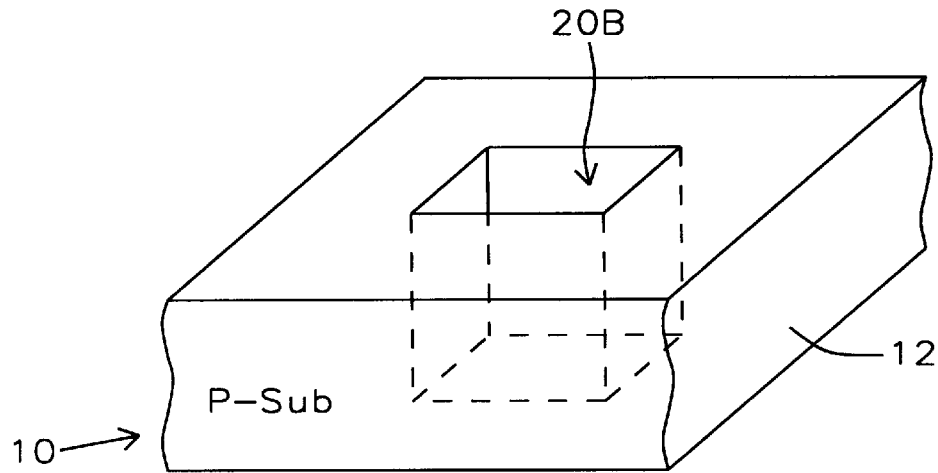
FIG. 7A shows a perspective view of a fragment of the device of FIG. 1 with one trench hole formed in the P-doped silicon semiconductor substrate.

FIG. 7A shows a perspective view of a fragment of the device 10 of FIG. 1 with one trench hole 20B formed in the P-doped silicon semiconductor substrate 12. FIG. 7A shows device 10 in an early stage of manufacture.

Figure 7B:
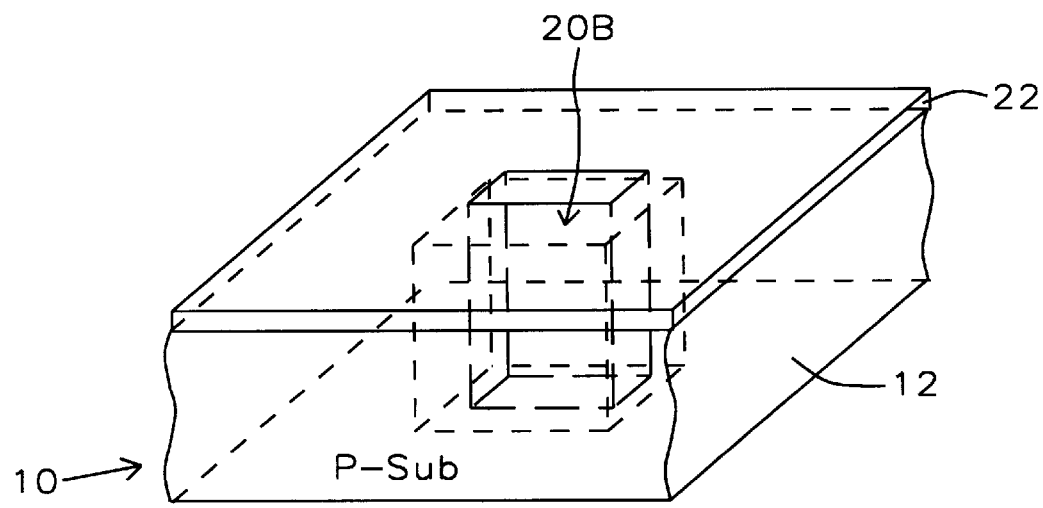
FIG. 7B shows the device of FIG. 7A after a thin tunnel oxide layer has been formed on the inner walls of a trench hole and on the surface of the substrate.

FIG. 7B shows the device of FIG. 7A after a thin tunnel oxide layer 22 has been formed on the inner walls of trench hole 20B and on the surface of substrate 12.

Figure 8:
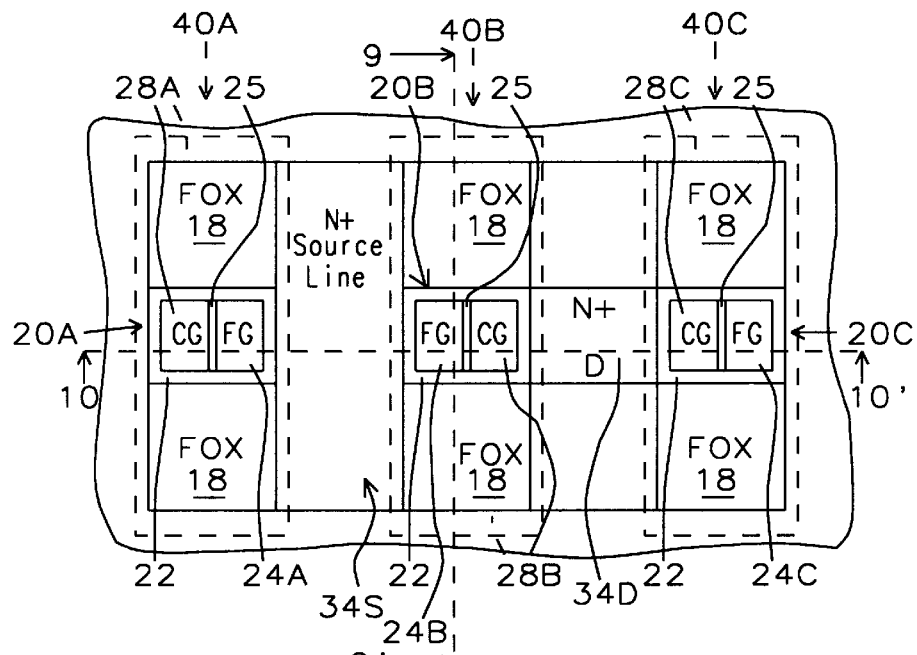
FIG. 8 shows the device of FIGS. 3–6, 7A and 7B in plan view with section line 9–9' through a flash memory gate electrode unit and with section line 10–10' across trench holes with a width of about 0.5 μm×about 0.5 μm of flash memory gate electrode units.

FIG. 8 shows the device of FIGS. 3–6, 7A and 7B in plan view with section line 9–9' through flash memory gate electrode unit 40B and with section line 10–10' across trench holes 20A, 20B, and 20C with a width of about 0.5 $\mu$m×about 0.5 $\mu$m of flash memory gate electrode units 40A, 40B and 40C.

Processing Steps

Figure 9A:
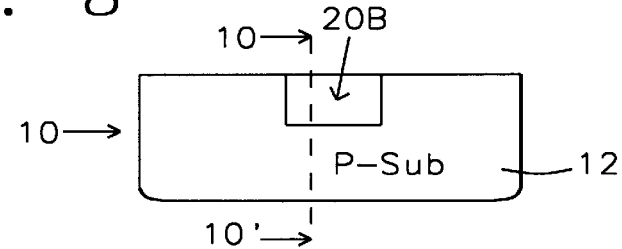
FIG. 9A shows a cross-sectional view of the device of FIG. 8 taken along line 9–9' of flash memory gate electrode unit 40B in an early stage of manufacture of the device.

FIG. 9A shows a cross-sectional view of the device of FIG. 8 taken along line 9–9' of flash memory gate electrode unit 40B in an early stage of manufacture of the device 10 in the stage shown in FIG. 7A with the trench hole 20B in substrate 12.

Figure 9B:
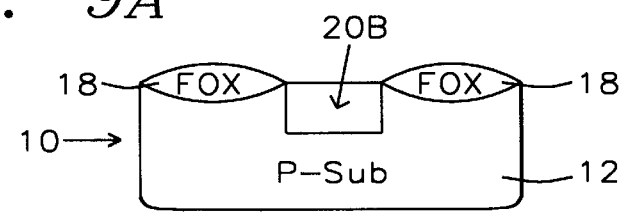
FIG. 9B shows the device of FIG. 9A after field oxide regions have been formed on the top and bottom of a flash memory gate electrode unit in FIG. 8.

Then follows a step of threshold ion implantation into the substrate 12 as shown in FIG. 9B, involving implantation at a tilt angle from about 15° to about 45° with a dosage of from about 5E12 ions/cm$^2$ to about 5E13 ions/cm$^2$ of boron or BF$_2$ at an energy from about 30 keV to about 60 keV.

FIG. 9B shows the device 10 of FIG. 9A after field oxide regions 18 have been formed on the top and bottom of flash memory gate electrode unit 40B in FIG. 8.

Figure 10:
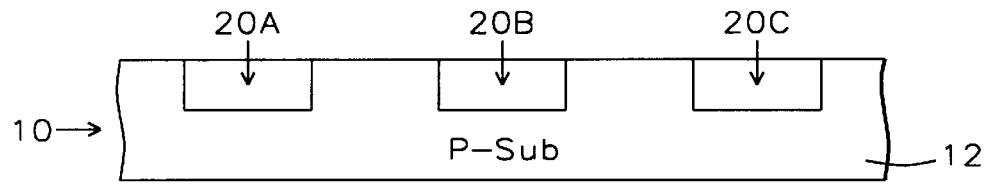
FIG. 10 shows a cross-sectional view of the device 10 taken along line 10–10' of FIGS. 8 and 9A of flash memory gate electrode units in an early stage of manufacture of the device in the stage shown in FIG. 9A with the trench holes in the substrate.

FIG. 10 shows a cross-sectional view of the device 10 taken along line 10–10' of FIGS. 8 and 9A of flash memory gate electrode units 40A, 40B and 40C in an early stage of manufacture of the device 10 in the stage shown in FIG. 9A with the trench holes 20A, 20B, and 20C in substrate 12.

Figure 11:
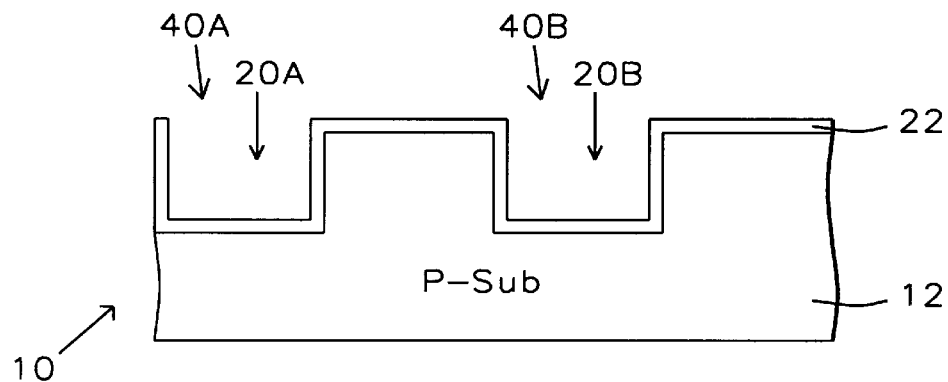
FIG. 11 shows an enlarged view of a fragment of the device of FIG. 10 after formation of the tunnel oxide layer over exposed surfaces of the substrate including the sidewalls and bottom surfaces of the trench holes which will form flash memory gate electrode units. The tunnel oxide layer is formed in a furnace in a conventional high temperature oxidation process, as will be understood by those skilled in the art.

FIG. 11 shows an enlarged view of a fragment of the device 10 of FIG. 10 after formation of the tunnel oxide layer 22 over exposed surfaces of the substrate 12 including the sidewalls and bottom surfaces of the trench holes 20A and 20B which will form flash memory gate electrode units 40A and 40B. The tunnel oxide layer 22 is formed in a furnace in a conventional high temperature oxidation process, as will be understood by those skilled in the art.

Figure 12:
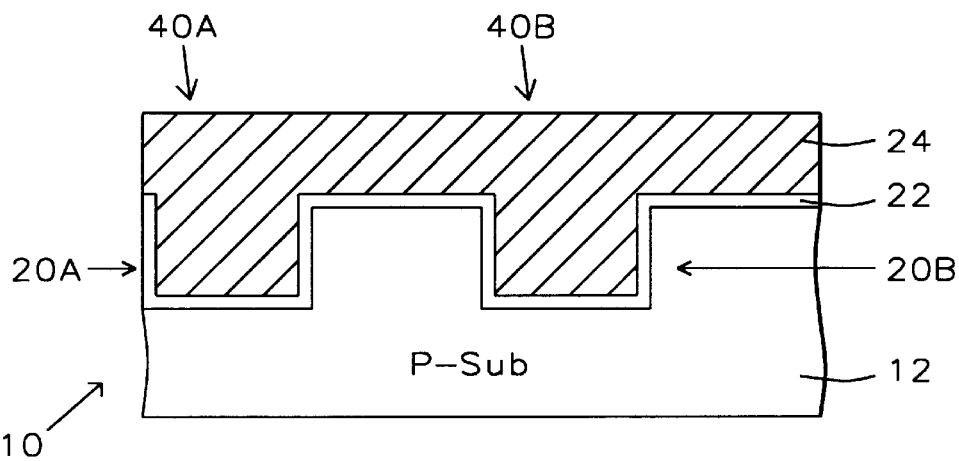
FIG. 12 shows the device of FIG. 11 after formation of a blanket layer of the first, doped polysilicon layer covering the tunnel oxide layer and filling the trench holes.

FIG. 12 shows the device 10 of FIG. 11 after formation of a blanket layer of the first, doped polysilicon layer 24 covering the tunnel oxide layer 22 and filling the trench holes 20A and 20B. Layer 24 has a thickness from about 500 Å to about 2,000 Å. Layer 24 will be used to form the floating gate electrodes 24A, 24B, etc. of the device 10.

Figure 13:
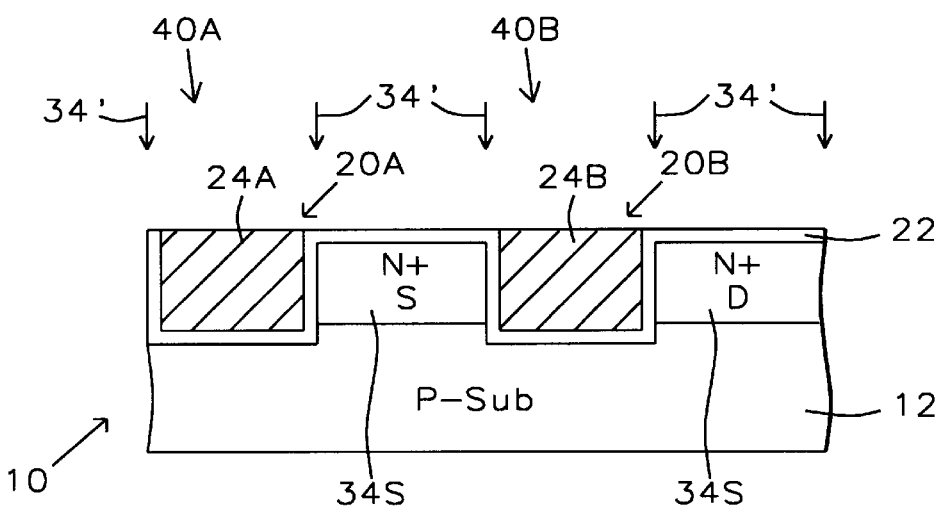
FIG. 13 shows the device 10 of FIG. 12 after CMP (Chemical Mechanical Polishing) of the layer leaving the surfaces of the tunnel oxide layer exposed aside from the trench holes, leaving a planarized surface on the top of the device.

FIG. 13 shows the device 10 of FIG. 12 after CMP (Chemical Mechanical Polishing) of the layer 24 leaving the surfaces of the tunnel oxide layer 22 exposed aside from the trench holes 20A and 20B, leaving a planarized surface on the top of device 10.

FIG. 13 also shows the device 10 of FIG. 12 after the subsequent step of forming source/drain regions 34S and 34D on the left and right sides of the trench hole 20B which were doped with a concentration of N-type phosphorus or arsenic (P/As) dopant from about 5 E 19 atoms/cm$^3$ to about 5 E 20 atoms/cm$^3$. That doping was achieved by the ion implantation of a dose of P/As ions 34' of N+ type dopant from about 1 E 15 ions/cm$^2$ to about 5 E 15 ions/cm$^2$ at an energy from about 25 keV to about 50 keV to form source/drain regions 34S and 34D.

Figure 14:
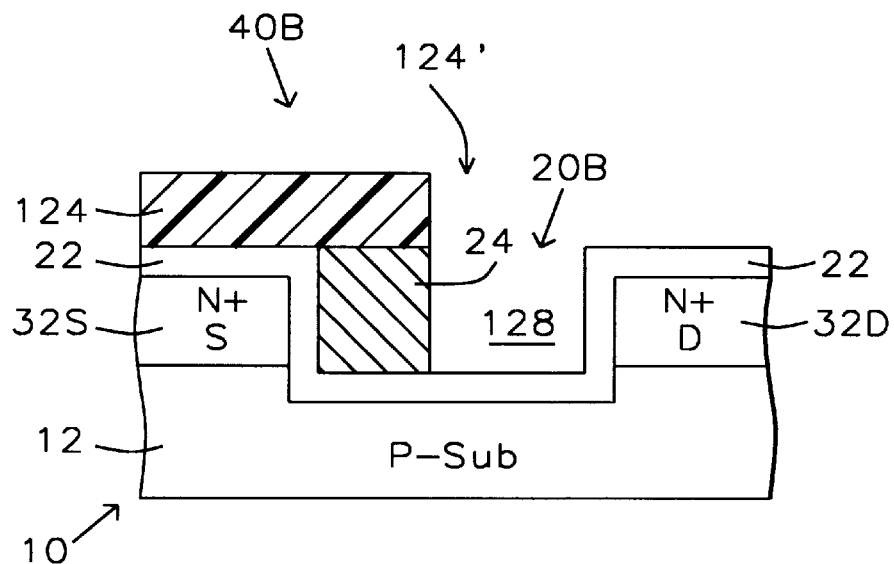
FIG. 14 shows the device of FIG. 13 after the formation of a floating gate photoresist mask thereover.

FIG. 14 also shows the device 10 of FIG. 13 after the formation of a floating gate photoresist mask 124 over the device 10. Mask 124 has an opening 124' over the portion of trench hole 20B where a control gate electrode hole 128 is to be opened in the right hand side of trench hole 20B exposing the tunnel oxide layer 22 in the hole 128 and to the right of hole 128.

Referring to FIG. 15, the first, doped polysilicon layer 24 has been patterned to comprise a floating gate electrode layer 24. The hole 128 serves a control gate space 128 for a dielectric layer 25 and the control gate electrode 28. A dielectric layer 25 reduces the size of control gate space 128 forming a reduced control gate space for the control gate electrode 28 adjacent to the floating gate electrode 24 in the trench hole 20. The control gate space extends 128 down to the dielectric layer 25 above the tunnel oxide layer on the drain region side of said trench hole.

Then the photoresist mask 124 is removed from the device 10.

FIG. 15 shows the device 10 of FIG. 14 after formation of a blanket interelectrode composed of ONO (silicon Oxide/silicon Nitride/silicon Oxide) or a CVD oxide, etc. dielectric layer 25. Layer 25 has a thickness from about 100 Å to about 250 Å.

Layer 25 was then coated with a blanket layer of the second, doped polysilicon layer 28 covering the tunnel oxide layer 22 and filling control gate electrode hole 128 in the trench hole 20B. Layer 28 has a thickness from about 1,000 Å to about 2,000 Å.

The result is a control gate (word line) electrode 28 with bottom portion 28B sharing the trench hole 20B with the floating gate electrode 24 and the tunnel oxide layer 22 and the interelectrode dielectric layer 25 and a top portion 28T covering the surface of the device 10 reaching over the floating gate electrode 24 and the N+ doped source/drain regions 32S/32D to form a split gate electrode. The combined thicknesses of tunnel oxide/dielectric layers 22/25 is from about 150 Å to about 350 Å between the control gate (word line) electrode 28 and source/drain regions 34S/34D. The floating gate electrode is separated from the drain region by the width of the bottom portion 28B of control gate electrode 28 as well as double thicknesses of the interelectrode dielectric layer 22 and one thickness of the tunnel oxide layer 22.

The source line region 34S and the drain line region 34D in FIG. 2 were doped with N-type dopant with a concentration of arsenic or phosphorus (As/P) dopant from about 5 E 19 atoms/cm$^3$ to about 5 E 20 atoms/cm$^3$.

Advantages of the Invention

1. The cell structure in accordance with this invention uses a vertical channel but not the traditional horizontal one.

2. The cell structure in accordance with this invention can pack more densely for a cell array since the channel is vertically oriented with respect to the wafer surface.

3. The step height of a stacked gate structure in accordance with this invention has a cell structure with a lower position in the substrate.

4. With this memory cell, during the programming procedure, the punch-through phenomenon is completely prevented.

5. There is a high source coupling ratio for a cell in accordance with this invention. Accordingly, the source side injection is more efficient.

6. There is a high gate coupling ratio for this cell. Thus, the negative gate source erase procedure is more efficient.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A vertical memory split gate flash memory device on a silicon semiconductor substrate comprising:

a floating gate trench hole in said silicon semiconductor substrate with a top surface, said trench hole defining a hollow space in said substrate with an opening through said top surface of said substrate, said trench hole having trench hole surfaces including sidewalls and a base formed at the bottom of said trench hole within said substrate, a tunnel oxide layer formed on said trench hole surfaces, said tunnel oxide layer having outer surfaces, a floating gate electrode layer having originally filled said trench hole on said outer surfaces of said tunnel oxide layer formed into a floating gate electrode juxtaposed with a control gate space in said trench hole, said floating gate electrode layer having been polished down to the surface of said substrate in said trench hole, source/drain regions in said substrate self-aligned with said floating gate electrode layer, said control gate space extending down to said tunnel oxide layer on said drain region side of said trench hole, an interelectrode dielectric layer over the top surface of said floating gate electrode, and over said tunnel oxide layer forming a reduced control gate space in said control gate space, and a control gate electrode over said interelectrode dielectric layer over the top surface of said floating gate electrode and extending down into said reduced control gate space in said trench hole.

2. A memory device in accordance with claim 1 wherein:

said trench hole has a depth from about 2,000 Å to about 8,000 Å.

3. A memory device in accordance with claim 1 wherein:

said tunnel oxide layer has a thickness from about 70 Å to about 150 Å, and said floating gate electrode has a thickness of from about 500 Å to about 2,000 Å.

4. A memory device in accordance with claim 1 wherein:

said threshold implant comprises boron which was implanted with a concentration of dopant from about 5 E 16 atoms/cm$^3$ to about 5 E 17 atoms/cm$^3$.

5. A memory device in accordance with claim 1 wherein:

source/drain regions were ion implanted with atoms selected from the group consisting of arsenic and phosphorus ions with a concentration of dopant from about 5 E 19 atoms/cm$^3$ to about 5 E 20 atoms/cm$^3$.

6. A memory device in accordance with claim 1 wherein:

said floating gate electrode comprises doped polysilicon with a thickness from about 500 Å to about 2,000 Å.

7. A memory device in accordance with claim 1 wherein:

a source line and a drain line are formed on opposite sides of said trench hole, said source line region is provided on the source side of said trench hole aligned with and adjacent to said source region, said drain line region is provided on the drain side of said trench hole aligned with and over said drain region.

8. A memory device in accordance with claim 7 wherein:

said source line region and said drain line region were doped with an N-type dopant selected from the group consisting of arsenic and phosphorus ions with a concentration of dopant from about 5 E 19 atoms/cm$^3$ to about 1 E 20 atoms/cm$^3$.

9. A memory device in accordance with claim 8 wherein:

said floating gate electrode comprises doped polysilicon with a thickness from about 500 Å to about 2,000 Å.

10. A memory device in accordance with claim 1 wherein the following memory cell operation conditions obtain:

|  |  | Prog. | Erase | Read |
|---|---|---|---|---|
| BIT LINE | Sel. | $V_{cc}$ | Floating | $V_{cc}$ |
| (DRAIN) | Unsel. | 0 | 0 | 0 |
| WORD LINE | Sel. | $V_{cc}$ | $(V_{pp})$ | $V_{cc}$ |
| (GATE) | Unsel. | 0 | 0 | 0 |
| SOURCE | Sel. | $V_{pp}$ | $V_{cc}$ | 0 |
|  | Unsel. | 0 | 0 | 0 |
| BULK | Sel. | 0 | 0 | 0 |
|  | Unsel. | 0 | 0 | 0 |

11. A device in accordance with claim 10 wherein:

said control gate electrode comprises doped polysilicon with a thickness from about 1,000 Å to about 2,500 Å.

12. A memory device in accordance with claim 9 wherein:

said control gate electrode comprises doped polysilicon with a thickness from about 1,000 Å to about 2,500 Å.

13. A vertical memory split gate flash memory device on a silicon semiconductor substrate comprising:

an array of floating gate trench holes in said silicon semiconductor substrate with a top surface, each of said trench holes defining a hollow space in said substrate with an opening through said top surface of said substrate, each of said trench holes having trench hole surfaces including sidewalls and a base formed at the bottom of each of said trench holes within said substrate, a tunnel oxide layer formed on said trench hole surfaces, said tunnel oxide layer having outer surfaces, a floating gate electrode layer having originally filled said trench holes on said outer surfaces of said tunnel oxide layer formed into a floating gate electrode juxtaposed with a control gate space in each of said trench holes, each of said floating gate electrodes having been polished down to the surface of said substrate in said trench holes, source/drain regions in said substrate self-aligned with said floating gate electrode layer, said control gate spaces in said trench holes extending down to said tunnel oxide layer on said drain region side of said trench holes, an interelectrode dielectric layer over the top surface of said floating gate electrode, and over said tunnel oxide layer forming a reduced control gate space in said control gate space, and a control gate electrode over said interelectrode dielectric layer over the top surface of said floating gate electrode and extending down into said reduced control gate space in said trench holes.

14. A memory device in accordance with claim 13 wherein:

each of said trench holes has a depth from about 2,000 Å to about 8,000 Å, said tunnel oxide layer has a thickness from about 70 Å to about 150 Å, said floating gate electrode has a thickness of from about 500 Å to about 2,000 Å, said threshold implant comprises boron which was implanted with a concentration of dopant from about 5 E 16 atoms/cm³ to about 5 E 17 atoms/cm³, source/drain regions were ion implanted with atoms selected from the group consisting of arsenic and phosphorus ions with a concentration of dopant from about 5 E 19 atoms/cm³ to about 5 E 20 atoms/cm³, and said floating gate electrode comprises doped polysilicon with a thickness from about 500 Å to about 2,000 Å.

15. A memory device in accordance with claim 14 wherein the following memory cell operation conditions obtain:

|  |  | Prog. | Erase | Read |
|---|---|---|---|---|
| BIT LINE | Sel. | $V_{cc}$ | Floating | $V_{cc}$ |
| (DRAIN) | Unsel. | 0 | 0 | 0 |
| WORD LINE | Sel. | $V_{cc}$ | $(V_{pp})$ | $V_{cc}$ |
| (GATE) | Unsel. | 0 | 0 | 0 |
| SOURCE | Sel. | $V_{pp}$ | $V_{cc}$ | 0 |
|  | Unsel. | 0 | 0 | 0 |
| BULK | Sel. | 0 | 0 | 0 |
|  | Unsel. | 0 | 0 | 0 |

16. A memory device in accordance with claim 15 wherein:

a source line and a drain line are formed on opposite sides of said trench holes, said source line region is provided on the source side of each of said trench holes aligned with and adjacent to said source region, said drain line region is provided on the drain side of each of said trench holes aligned with and over said drain region, said source line region and said drain line region were doped with an N-type dopant selected from the group consisting of arsenic and phosphorus ions with a concentration of dopant from about 5 E 19 atoms/cm³ to about 1 E 20 atoms/cm³, said floating gate electrode comprises doped polysilicon with a thickness from about 500 Å to about 2,000 Å, said control gate electrode comprises doped polysilicon with a thickness from about 1,000 Å to bout 2,500 Å, and each of said trench holes has a depth from about 2,000 Å to about 8,000 Å.

17. A vertical memory split gate flash memory device on a silicon semiconductor substrate comprising:

an array of floating gate, cubic trench holes in said silicon semiconductor substrate with a top surface, each of said cubic trench holes defining a hollow cubic space in said substrate with an opening through said top surface of said substrate, said cubic trench holes having trench hole surfaces including sidewalls and a base formed at the bottom of said cubic trench holes within said substrate, a tunnel oxide layer formed on said trench hole surfaces, said tunnel oxide layer having outer surfaces, a floating gate electrode layer having originally filled said cubic trench holes on said outer surfaces of said tunnel oxide layer, said floating gate electrode layer having been polished down to the surface of said substrate in said cubic trench holes, source/drain regions in said substrate self-aligned with said floating gate electrode layer, said floating gate electrode layer having a control gate space formed adjacent thereto in said cubic trench holes, said control gate spaces in said cubic trench holes extending down to said tunnel oxide layer on said drain region side of said cubic trench holes, an interelectrode dielectric layer over the top surface of said floating gate electrode, and over said tunnel oxide layer forming a reduced control gate space in said control gate space, and a control gate electrode over said interelectrode dielectric layer over the top surface of said floating gate electrode and extending down into said reduced control gate space in said trench holes.

18. A device in accordance with claim 17 wherein:

said cubic trench holes have a depth from about 2,000 Å to about 8,000 Å, said tunnel oxide layer has a thickness from about 70 Å to about 150 Å, and said floating gate electrode has a thickness of from about 500 Å to about 2,000 Å, said threshold implant comprises boron which was implanted with a concentration of dopant from about 5 E 16 atoms/cm$^3$ to about 5 E 17 atoms/cm$^3$.

source/drain regions were ion implanted with atoms selected from the group consisting of arsenic and phosphorus ions with a concentration of dopant from about 5 E 19 atoms/cm$^3$ to about 5 E 20 atoms/cm$^3$, and said floating gate electrode comprises doped polysilicon with a thickness from about 500 Å to about 2,000 Å.

19. A device in accordance with claim 18 wherein the following memory cell operation conditions obtain:

|  |  | Prog. | Erase | Read |
|---|---|---|---|---|
| BIT LINE | Sel. | $V_{cc}$ | Floating | $V_{cc}$ |
| (DRAIN) | Unsel. | 0 | 0 | 0 |
| WORD LINE | Sel. | $V_{cc}$ | $(-V_{pp})$ | $V_{cc}$ |
| (GATE) | Unsel. | 0 | 0 | 0 |
| SOURCE | Sel. | 0 | 0 | 0 |
|  | Unsel. | 0 | 0 | 0 |
| BULK | Sel. | 0 | 0 | 0 |
|  | Unsel. | 0 | 0 | 0 |

20. A device in accordance with claim 19 wherein said control gate electrode comprises doped polysilicon with a thickness from 1,000 Å to 2,500 Å.

* * * * *